US006492657B1

(12) United States Patent
Burlefinger et al.

(10) Patent No.: US 6,492,657 B1
(45) Date of Patent: Dec. 10, 2002

(54) INTEGRATED SEMICONDUCTOR MICROCHANNEL PLATE AND PLANAR DIODE ELECTRON FLUX AMPLIFIER AND COLLECTOR

(75) Inventors: Erich Burlefinger, Lancaster, PA (US); Charles M. Tomasetti, Leola, PA (US)

(73) Assignee: Burle Technologies, Inc., Wilmington, DE (US)

( * ) Notice: Subject to any disclaimer, the term of this patent is extended or adjusted under 35 U.S.C. 154(b) by 0 days.

(21) Appl. No.: 09/492,480

(22) Filed: Jan. 27, 2000

(51) Int. Cl.[7] ................................................ H01L 29/06
(52) U.S. Cl. .................. 257/10; 250/207; 313/103 CM
(58) Field of Search ............................ 250/207, 370.01; 313/103 R, 103 CM, 105 R, 105 CM

(56) References Cited

U.S. PATENT DOCUMENTS

| | | | | |
|---|---|---|---|---|
| 3,668,473 A | | 6/1972 | Miyashiro et al. | |
| 3,699,375 A | | 10/1972 | Weibel | |
| 3,778,657 A | | 12/1973 | Kubo et al. | |
| 3,879,626 A | | 4/1975 | Washington et al. | |
| 4,015,159 A | | 3/1977 | Zipfel, Jr. | |
| 4,020,376 A | | 4/1977 | Bosserman et al. | |
| 4,945,286 A | | 7/1990 | Phillips et al. | |
| 4,950,939 A | | 8/1990 | Tosswill | |
| 5,086,248 A | | 2/1992 | Horton et al. | |
| 5,264,693 A | | 11/1993 | Shimabukuro et al. | |
| 5,306,904 A | | 4/1994 | Shimabukuro et al. | |
| 5,329,110 A | | 7/1994 | Shimabukuro et al. | |
| 5,568,013 A | | 10/1996 | Then et al. | |
| 5,591,986 A | | 1/1997 | Niigaki et al. | |
| 5,680,007 A | | 10/1997 | Niigaki et al. | |
| 5,710,435 A | | 1/1998 | Niigaki et al. | |
| 5,747,826 A | | 5/1998 | Niigaki et al. | |
| 5,914,491 A | * | 6/1999 | Salokatve et al. | 250/370.01 |
| 6,384,519 B1 | * | 5/2002 | Beetz, Jr. et al. | 313/103 CM |

* cited by examiner

*Primary Examiner*—Olik Chaudhuri
*Assistant Examiner*—Douglas A. Wille
(74) *Attorney, Agent, or Firm*—John B. Berryhill; Dann Dorfman Herrell & Skillman

(57) ABSTRACT

An electron flux amplifier is provided wherein a microchannel plate (MCP) is monolithically formed with, or bonded to, a semiconductor amplifier. In a preferred embodiment, microchannels are formed to extend into a semiconductor substrate to a predetermined depth from the surface, and a collection diode is formed in the substrate beneath the channels. The collection diode may comprise a single planar diode, or a plurality of electrically isolated diodes to provide for imaging of the electron flux. The electron flux amplifier may be used as a detector in a photomultiplier tube (PMT) having a photoelectronically responsive input surface and one or more accelerating electrodes for directing a photoelectron flux toward the electron flux amplifier.

19 Claims, 3 Drawing Sheets

INTEGRATED SEMICONDUCTOR MICROCHANNEL PLATE AND PLANAR DIODE ELECTRON FLUX AMPLIFIER AND COLLECTOR

FIELD OF THE INVENTION

The present invention relates to an electronic current amplification and collection structure for photomultiplier tubes and to a photomultiplier tube incorporating such a structure. In particular the current amplification and collection structure includes a micro-channel plate multiplier and a reverse-biased semiconductor diode.

BACKGROUND

Photomultiplier tubes are known for detection or imaging of electromagnetic signals including signals of particular spectral characteristics such as infra-red signals, visible light signals, ultra-violet, x-rays, and gamma rays. In a typical photomultiplier tube, photons of such signals are incident upon a biased conductive surface, a photocathode, which emits electrons via the photoelectric effect. These primary electrons are then accelerated toward a biased conductor, or dynode, which emits further electrons, i.e., secondary electrons. Amplification is achieved within a photomultiplier tube by arranging several dynodes to receive incident electrons and to emit secondary electrons, and by configuring the biasing electric fields among the dynodes to guide the emitted electrons along paths between successive dynodes. Ultimately, the cascading stream of electrons is collected to provide an electrical current proportional to the incident photon flux. The degree of amplification provided between the initial photon flux and the collected electron current is determined by factors including the electron emission characteristics of the dynodes, the number of dynode stages, and the voltage applied between successive dynodes for accelerating the electrons.

It is desirable for photomultiplier tubes to provide as high an amplification as possible for a given applied voltage. It is also desirable for photomultiplier tubes to be compact and mechanically reliable. For imaging purposes, it is also desirable for the two-dimensional cross section of the amplified electron stream to accurately represent the two-dimensional distribution of incident photons.

One device for amplifying an electron beam while maintaining the two-dimensional distribution of the beam is a microchannel plate. For example, U.S. Pat. No. 5,086,248 to Horton et al. describes methods for producing a variety of microchannel plate structures formed from semiconductor wafers. A typical microchannel plate includes a body of secondary electron emissive material having a number of pores extending through the body. Electrodes formed on respective sides of the body allow application of a bias voltage parallel to the direction of the pores. In operation, incident electrons collide with the walls of the pores, thus causing a cascade of secondary electrons which further collide with the pore walls to provide amplification of the incident photon flux.

SUMMARY OF THE INVENTION

In accordance with one aspect of the present invention, a device for amplifying and collecting electron current in a photomultiplier tube is provided. The device combines a microchannel plate (MCP) formed of a semiconductor material and a planar, reverse-biased semiconductor diode for collecting electrons emitted from the microchannel plate. The MCP and reverse-biased diode may be provided as a monolithic structure by forming the MCP in a semiconductor substrate such that the channels of the MCP extend into the substrate to a predetermined depth, and by forming the diode to be located beneath the bottom of the channels.

In accordance with another aspect of the present invention, amplification and collection of an electron flux is enhanced by a structure incorporating a microchannel plate and a planar diode. The microchannel plate and diode are preferably formed monolithically. The microchannel plate amplifies an incident electron flux by emission of secondary electrons. The diode is configured to provide solid-state amplification by mechanisms of electron bombardment induced current (EBIC) and/or by avalanche generation of excess carriers.

BRIEF DESCRIPTION OF THE DRAWINGS

The foregoing summary, as well as the following detailed description, will be best understood in connection with the attached drawings in which.

DETAILED DESCRIPTION

Figure 1A:
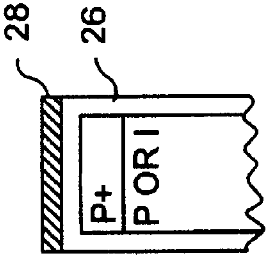
FIG. 1A is a partial sectional view of an alternative arrangement of the microchannel formed in the device of FIG. 1.
Figure 1:
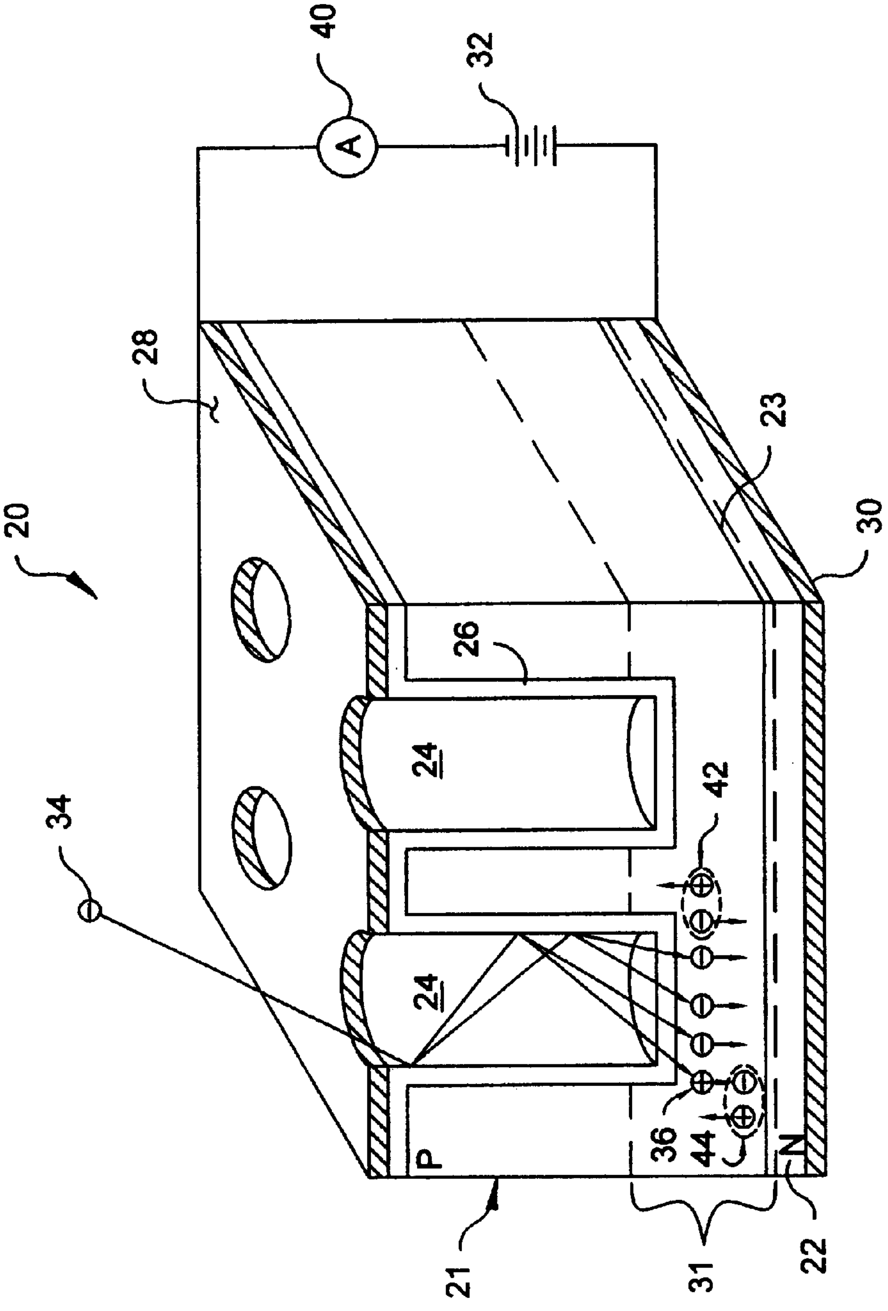
FIG. 1 is a perspective view in partial cross-section of an electron flux amplification and collection device according to one embodiment of the present invention.

Referring now to FIG. 1. there is shown an electron current multiplication and collection device 20. The device 20 is formed of a substrate of p-type semiconductor material in which a pn-junction 23 has been formed by providing an n-type semiconductor region 22 in or on one side of the substrate 21, hereinafter referred to as the back side of the substrate 21. The semiconductor material forming the substrate 21 is preferably silicon but may also be a semiconductor material in which a pn-junction can be formed by such techniques as diffusion, epitaxy, ion implantation, and the like.

Channels 24 are formed to extend into the top side of the substrate 21. The bottoms of the channels 24 terminate within the substrate. The channels 24 are preferably formed by selective chemical or physical etching, such as plasma etching, or by other techniques such as laser-assisted drilling. The interior walls of the channels 24 are preferably formed of or coated with a layer of secondary emission material 26, that is selected to emit secondary electrons in response to electron bombardment when the device is appropriately biased. The secondary emission layer 26 extends as shown along the front side of the substrate. The secondary emission layer 26 is preferably applied by known thin-film deposition methods or may be formed of an appropriate semiconductor material. The secondary emission layer 26 may also include an emission enhancing layer for providing additional secondary electron emission. The emission enhancing layer may be formed in-situ of the same material as the substrate by, for example, thermal oxidation.

A conductive, preferably metallic, contact 28 is formed on the front side of the device 20 to provide electrical contact to the secondary emission layer 26. Another contact 30 is formed on the back side of the substrate to provide electrical contact to the n-type semiconductor region 22. In operation, the device 20 is biased by connection of a voltage source 32 with the respective contacts 28 and 30 such that the pn-junction is reverse biased, and the secondary emission layer 26 is subjected to a gradient bias extending from the top of the channels 24 to the bottoms thereof. The relative doping of the p- and n-type regions of the substrate is selected so that the depletion region 31 preferably extends to a position at least adjacent to the bottoms of the respective channels 24 when the operative bias is applied.

As illustrated in FIG. 1, when an incident electron 34 enters a channel 24 and collides with a side wall thereof, the secondary emission layer 26 emits secondary electrons, which are accelerated toward the bottom of the channel. The secondary electrons collide with the wall of the channel, producing an amplification of electron current as they traverse along the length of the channel. At the bottom of the channel, the resulting electrons 36 are injected into the substrate in the depletion region 31 of the pn-junction 23. Alternatively, if the depletion region does not extend as far into the p-type region, as shown in FIG. 1, the electrons 36 would diffuse within the p-type semiconductor to the edge of the depletion region. In such an alternative arrangement, the depletion region 31 preferably extends at least to within the minority carrier diffusion length for the p type semiconductor of which the substrate is formed.

Once the electrons 36 enter the depletion region, the electric field therein sweeps the electrons 36 across the junction 23 into the n-type region, for collection by the contact 30. An electrical current is thereby produced that can be measured by, for example, an ammeter 40. Additionally, the electrical current produced can be further amplified and/or subjected to various electronic manipulation and analysis for providing useful indicia regarding the incident photon flux.

It will be appreciated that alternative device configurations can be formed for providing a depletion region to collect minority carrier electrons from the p-type semiconductor substrate. In one such alternative embodiment, the backside conductive contact is selected to form a Schottky barrier with the substrate. The width of the depletion region will then depend on the relative work functions of the substrate and the conductive contact, and on the bias voltage applied to the contact. Such an alternative arrangement, which provides an electron collector, is particularly desirable where the substrate is a compound semiconductor, including III-V semiconductors such as GaAs and alloys thereof. Further alternative structures, such as metal-insulator-semiconductors (MIS), are also suitable for providing a depletion region within the substrate for collecting the injected electrons. These alternative structures can be patterned, as discussed below, for imaging applications.

The device 20 is capable of providing amplification of electric current in excess of the amplification that would otherwise be provided by a known microchannel plate configured of the same substrate and having the same geometry and secondary emission layer. This result is due to amplification effects that may occur after the resulting electrons are injected into the substrate. For example, electrons that have been accelerated within the channel to an energy of about 3.6 eV in excess of the thermal energy of electrons in the substrate are capable of generating electron-hole pairs in the substrate upon injection therein, as shown at 42. Such electron-hole pair generation adds an electron bombardment induced current (EBIC) component to the overall current generated by the device. Additionally, the doping of the substrate 21, or at least the depletion region 31, may be selected so that electrons are accelerated within the depletion region to an energy sufficient to cause interaction with the crystal lattice, i.e., an avalanching effect, resulting in further generation of electron-hole pairs, such as shown at 44. Such avalanche current may add a further component to the overall amplification.

As can be appreciated, the relative conductivity of the p-type semiconductor substrate 21 should be lower than that of the secondary emission layer 26 in order to maintain a suitable bias along the length of the channel walls. Suitable materials for the secondary emission layer 26 include silicates; doped glasses, such as lead glass (PbO—$SiO_2$); metal-alkali coatings, such as alkali-ant imonides, including metal oxides, such as MgO or $Al_2O_3$; doped polycrystalline diamond; or other secondary emitters known in the art. Where the substrate 21 is silicon, the secondary emission layer 26 may be formed by doping or evaporating suitable material onto a thermal oxide layer composed of the substrate material. Where significantly resistive secondary emission layers are used, the p-type substrate should be lightly doped (e.g., less than about $10^{18}$ $cm^{-3}$ for a silicon substrate), and may include intrinsic or compensated semiconductor material (i.e., undoped material or material that has been doped to compensate for excess impurities). The relatively light doping of the p-type material enhances the extent of the depletion region in the substrate, and it may be desirable in some embodiments to provide a depletion region which extends beyond the bottoms of the channels, or even along the entire length of the channels, during operation. Although the channels 24 are shown to be vertically-oriented in FIG. 1, it is recognized that the channels may be formed to increase the likelihood of electron collisions by tapering the channels from top to bottom. Such a tapered profile can be obtained by using an isotropic etch to form the channels to be wider at the top or front surface of the device than at the bottom or rear ends thereof.

In a further alternative embodiment, the channels may be formed at an angle relative to the surface in order to increase the likelihood of electron collisions with the walls of the channels. Such an angled channel structure can be formed of known crystallographic etching techniques.

In order to make ohmic contact to the p-type material in embodiments where light doping is utilized, a more heavily doped $p^+$ region is provided in the upper surface of the semiconductor substrate as shown in FIG. 1A. The diode structure thus provided vertically through the substrate then resembles a $p^+$-p-n diode or a p-i-n diode. The doping gradient near the upper surface region of the device also serves to produce an internal field that aids in the collection of electrons injected or generated in the more lightly doped p-type region of the device. In such an embodiment, electrical contact to the $p^+$ material is made through vias formed in the secondary emission layer 26. Alternatively, discrete $p^+$ regions may be formed in the upper surface region of substrate 21 to provide ohmic contact with the metallic layer 28.

Figure 2A:
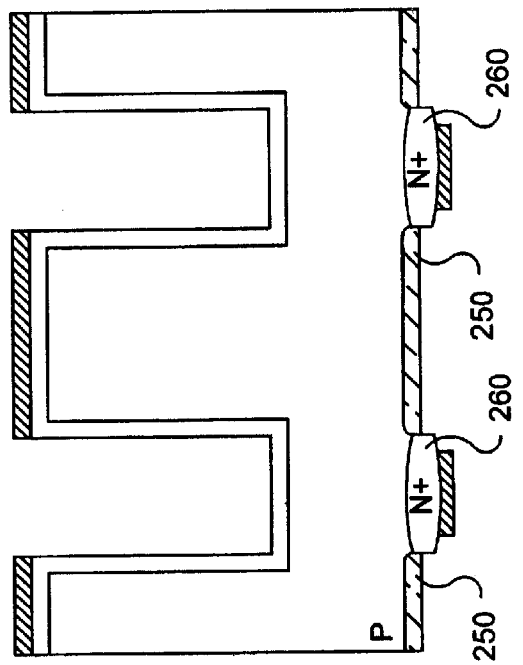
FIG. 2A is a sectional view of an alternative embodiment of a device configured for imaging applications.
Figure 2:
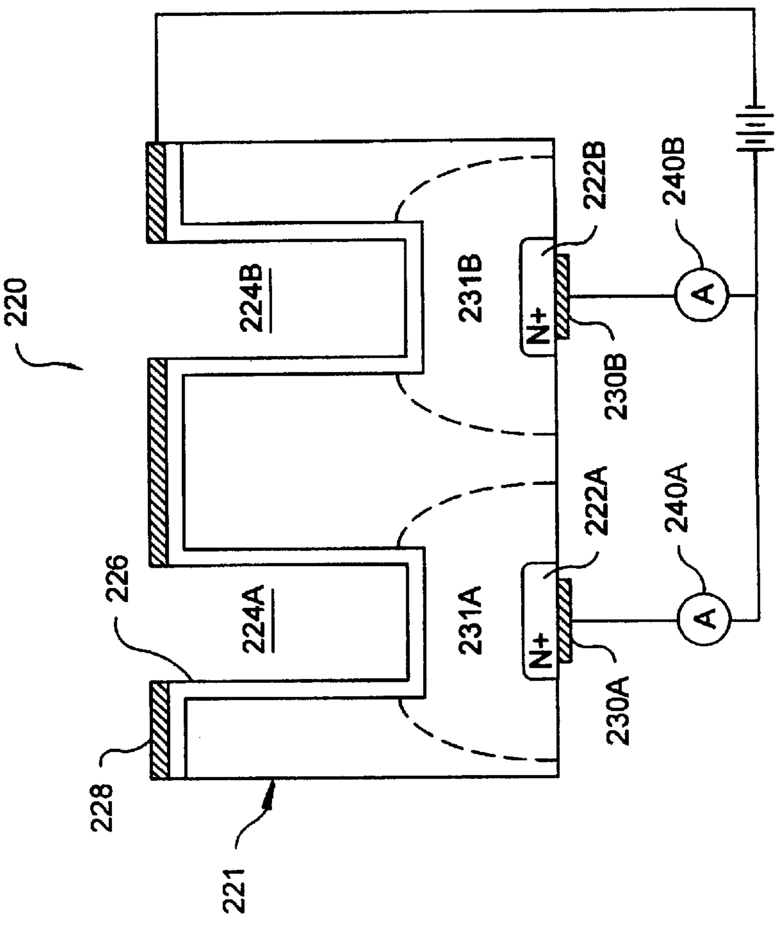
FIG. 2 is a sectional view of a device according to this invention that is configured for an imaging application.

Referring now to FIG. 2, there is shown a structure 220 suitable for electron amplification and collection wherein imaging of the incident flux is desired. The device 220 is formed of a p-type semiconductor substrate 21, and has a plurality of channels formed therein. The channels 224*a* and 224*b* which are representative of the channels formed in substrate 221 are lined with a secondary emission layer 226. A metallic contact 228 is provided on the front side of the device 220, as described above in connection with the device 20. On the back side of the substrate, discrete n or $n^+$ regions 222*a* and 222*b* are formed beneath the respective channels 224*a* and 224*b*. The $n^+$ regions 222*a* and 222*b* are aligned centrally with the bottoms of respective channels 224*a* and 224*b*. Discrete metallic contacts 230*a* and 230*b* are formed in contact with the respective $n^+$ regions 222*a* and 222*b*. Electrons received and amplified along channel 224*a* will drift into depletion region 231*a* for collection at $n^+$ region 222*a*. Electrons received and amplified along channel 224*b* will drift into depletion region 231*b* for collection at $n^+$ region 222*b*.

The device 220 of FIG. 2 functions similarly to the device 20 with respect to amplification and collection of an incident electron flux. However, the arrangement of discrete $n^+$ regions 222*a* and 222*b* and corresponding contacts 230*a* and 230*b* allows electrical current from each of the $n^+$ region to be measured, for example by ammeters 240*a* and 240*b*, in a manner that provides a two-dimensional image of the incident flux.

In order to provide for independent detection of electron flux within each of the channels 224*a* and 224*b*, the $n^+$ regions 222*a* and 222*b* are electrically isolated by virtue of the series-opposing diodes formed thereby. The material parameters of the substrate are chosen to prevent the depletion regions 231*a* and 231*b* from overlapping. To further enhance isolation between depletion regions 231*a* and 231*b*, or to provide such isolation in a lightly doped substrate, it may be desirable to form physical barriers between adjacent $n^+$ regions in the imaging device 220. For example, in FIG. 2A, there is shown an embodiment wherein insulating regions 250 (e.g. of $SiO_2$ or SiN) are formed between adjacent $n^+$ regions 260. The insulating regions 250 serve to confine collection of electrons from the respective channels to the corresponding $n^+$ regions formed in the bottom surface of the substrate. In other alternative embodiments, such isolation may be provided by etched grooves or trenches formed in the substrate between adjacent $n^+$ regions. In a further alternative embodiment, individual collection regions are established to collect electrons from groups of two or more channels as desired to obtain a specified spatial resolution and gain per image element.

Figure 3:
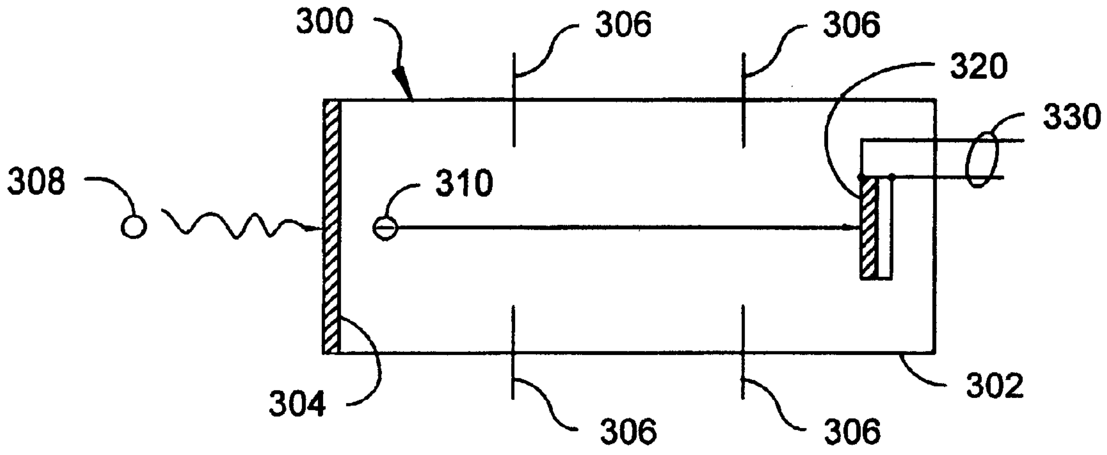
FIG. 3 is a schematic diagram of a photomultiplier tube employing an electron flux amplification and collection device according to the present invention.

Referring now to FIG. 3, there is shown a photomultiplier tube 300. The photomultiplier tube 300 includes an evacuated glass envelope 302 having a photocathode 304 located at a forward interior portion of the envelope 302. An electron amplification and collection device 320 of any of the configurations described above is positioned at the rear of the envelope 302. Focus electrodes 306 are positioned along the length of the envelope 302 to accelerate and direct electrons within the interior of the envelope toward the amplification and collection device.

In operation, the photocathode end of photomultiplier tube 300 is directed at a source of photons. An incident photon 308, upon colliding with the photocathode 304, generates a photoelectron 310 which is released from the photocathode 304 into the interior of the envelope 302. Appropriate voltage biases applied to the photocathode 304 and to the focus electrodes 306, cause the photoelectron 310 to accelerate toward the amplification and collection device 320. The resulting current generated by the collection device 30, including current components generated by secondary emission amplification, electron bombardment induced current, and avalanching, is provided to external instrumentation (not shown) through electrical leads 330 connected with the device 320 and leading through the envelope 302 to the exterior of the photomultiplier tube.

The device 320 is constructed in accordance with any of the embodiments described above in which a single collection layer on the bottom side of the device is provided for collecting the total current generated in the device, or wherein discrete collection regions are provided for imaging purposes. The photomultiplier tube 300 may be of the type shown wherein the device 320 provides substantially all of the amplification available. Alternatively, one or more dynodes may be positioned within the envelope to provide further amplification of the electron flux within the photomultiplier as desired in accordance with known techniques.

For certain applications it may be desirable to allow independent optimization of the respective microchannel plate and EBIC diode components of the amplification and collection device of the present invention. Such optimization is provided in the device structure shown in FIG. 4, wherein the device is composed of two discrete parts that are held in a mechanically fixed relationship to accomplish the functions of secondary emission amplification in one part, and collection of electrons in the other part (along with solid-state amplification of current by EBIC and/or avalanche mechanisms). Such a structure would be suitable for use in a photomultiplier tube of the type described in FIG. 3, or in a photomultiplier tube employing a series of intermediate dynodes.

Figure 4:
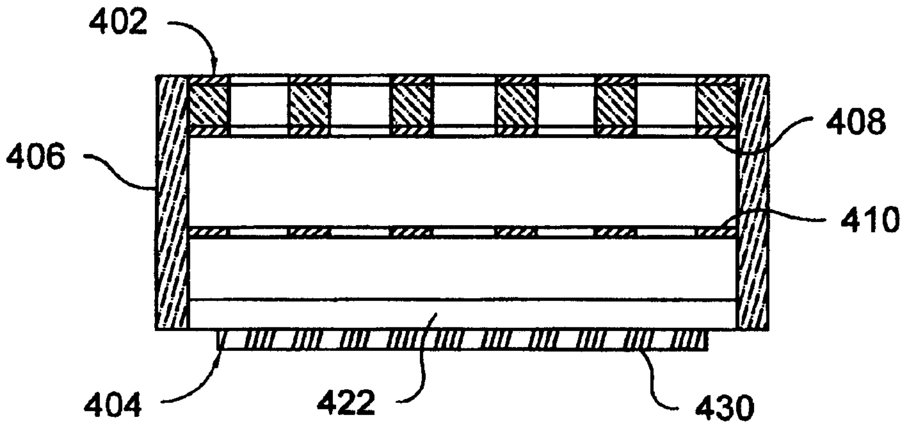
FIG. 4 is a sectional view of an alternative embodiment of the device wherein electron flux amplification and collection are provided by an assembly of two discrete components.

In the device shown in FIG. 4, a microchannel plate 402 and a planar diode 404 are held together by a fixture 406 for aligning the plate 402 and the planar diode 404. In an alternative embodiment, the function of holding the plate 402 and diode in alignment may comprise a suitable adhesive for directly bonding the two parts together. The planar diode 404 has a front contact 410, a single rear contact 430 and a single n doped collection layer 422. In an alternative embodiment, a plurality of such contacts and corresponding discrete collection regions may be provided in order to obtain imaging of the incident electron flux.

In the structure shown in FIG. 4, the EBIC component of electronic current generated in the planar diode 404 may be enhanced during operation of the device by applying a voltage bias between the rear contact 408 of the microchannel plate 402 and the front contact 410 of the planar diode 404. Such a bias accelerates electrons emitted from the rear of the microchannel plate 402, and thus increases the energy of the electrons incident upon the planar diode 404. Such increased energy enhances production of electron hole pairs within the planar diode 404 upon absorption of the incident electrons.

The terms and expressions which have been employed are used as terms of description and not of limitation. There is no intention in the use of such terms and expressions of excluding any equivalents of the features shown and described or any portions thereof. It is recognized, therefore, that various modifications are possible within the scope of the invention as claimed.

That which is claimed is:

1. A device for amplification and collection of an electron flux, comprising:

a substrate of semiconductor material having a channel extending thereinto from a top surface thereof;

a secondary electron emission layer formed on the interior of the channel;

a carrier collection means formed in a bottom surface region of the substrate and aligned to receive electrons from the channel.

2. The device of claim 1, comprising:

a first conductive contact formed on the top surface of the substrate; and a second conductive contact formed on the carrier collection means.

3. The device of claim 1 wherein the substrate is formed of a material comprising p-type semiconductor material and the carrier collection means is formed of a material comprising n-type semiconductor material.

4. The device of claim 1 wherein the secondary electron emission layer is formed of a material selected from the group consisting of a silicate, a doped glass, an alkali antimonide compound, a metal oxide, and a polycrystalline diamond layer.

5. The device of claim 1 wherein the secondary electron emission layer comprises PbO—$SiO_2$, or an alkali antimonide.

6. The device of claim 3 wherein the secondary electron emission layer comprises an emission enhancing layer formed in-situ.

7. The device of claim 6 wherein the semiconductor material comprises silicon.

8. The device of claim 3 comprising a heavily doped contact region formed in a region adjacent to the top surface of the substrate.

9. The device of claim 1 wherein the substrate adjacent the channel comprises substantially intrinsic semiconductor material.

10. The device of claim 1 wherein the carrier collection means is configured to provide a depletion region extending from the collector to at least the bottom of the channel.

11. The device of claim 10 wherein the substrate is configured to generate electron hole pairs in response to electron bombardment.

12. The device of claim 10 wherein the substrate is configured to provide avalanche generation of carriers in response to collection of electrons in the depletion region.

13. The device of claim 10 wherein the substrate is configured to provide avalanche generation of carriers when the pn-junction is reverse biased and the device is exposed to an electron flux.

14. The device of claim 1 comprising a plurality of channels extending into the substrate from the top surface thereof and aligned with said carrier collection means.

15. The device of claim 1 wherein the carrier collection means comprises means for producing a depletion region in the bottom surface region of the substrate.

16. The device of claim 15 wherein the means for producing a depletion region comprises a conductive contact from a Schottky barrier with the substrate.

17. The device of claim 16 wherein the substrate comprises a III-V semiconductor.

18. The device of claim 15 wherein the means for producing a depletion region comprises a metal-insulator-semiconductor structure formed adjacent to the bottom surface region of the substrate.

19. The device of claim 18 wherein the substrate comprises a III-V semiconductor.

* * * * *